United States Patent
Merchant et al.

(10) Patent No.: US 6,599,837 B1
(45) Date of Patent: Jul. 29, 2003

(54) CHEMICAL MECHANICAL POLISHING COMPOSITION AND METHOD OF POLISHING METAL LAYERS USING SAME

(75) Inventors: Sailesh Mansinh Merchant, Orlando, FL (US); Sudhanshu Misra, Orlando, FL (US); Pradip Kumar Roy, Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/515,730

(22) Filed: Feb. 29, 2000

(51) Int. Cl.$^7$ .......................... H01L 21/302; B24B 1/00
(52) U.S. Cl. ...................... 438/692; 51/307; 51/308; 51/309; 106/3; 252/79.4
(58) Field of Search ................ 438/633, 692, 438/693; 51/307, 308, 309; 106/3, 11; 216/89; 252/79.4; 510/175

(56) References Cited

U.S. PATENT DOCUMENTS

| | | | | |
|---|---|---|---|---|
| 4,086,176 A | * | 4/1978 | Ericson et al. | 252/100 |
| 4,959,113 A | * | 9/1990 | Roberts | 156/636 |
| 5,036,015 A | * | 7/1991 | Sandhu et al. | 438/14 |
| 5,196,353 A | * | 3/1993 | Sandhu et al. | 438/5 |
| 5,222,329 A | * | 6/1993 | Yu | 451/11 |
| 5,240,552 A | * | 8/1993 | Yu et al. | 438/5 |
| 5,340,370 A | | 8/1994 | Cadien et al. | |
| 5,637,185 A | | 6/1997 | Murarka et al. | |
| 5,643,050 A | * | 7/1997 | Chen | 451/10 |
| 5,770,095 A | | 6/1998 | Sasaki et al. | |
| 5,783,489 A | * | 7/1998 | Kaufman et al. | 438/692 |
| 5,836,806 A | * | 11/1998 | Cadien et al. | 451/41 |
| 5,897,375 A | * | 4/1999 | Watts et al. | 438/693 |
| 5,954,975 A | * | 9/1999 | Cadien et al. | 216/38 |
| 5,954,997 A | * | 9/1999 | Kaufman et al. | 252/79.1 |
| 6,068,879 A | * | 5/2000 | Pasch | 427/97 |
| 6,077,337 A | * | 6/2000 | Lee | 106/3 |
| 6,126,853 A | * | 10/2000 | Kaufman et al. | 252/79.1 |
| 6,217,416 B1 | * | 4/2001 | Kaufman et al. | 451/41 |

OTHER PUBLICATIONS

Luo et al., "Stabilization of Alumina Slurry for Chemical–Mechanical Polishing of Copper", 1996, Langmuir, 12 (15), pp. 3563–3566.*

Luo et al., "Copper Dissolution in Aqueous Ammonia–Containing Media during Chemical Mechanical Polishing", 1997, Chem. Mat., 9(10), pp. 2101–2106.*

Palla et al., "Stabilization of Alumina Slurries in Presence of Oxidizers for Tungsten Chemical Mechanical Polishing", Oct., 1998, 23$^{rd}$ IEEE Symposium on Elec. Manu. Tech., pp. 155–163.*

Romagna et al., "Copper CMP Evaluation: slurry chemical effect on planarization", Mar. 1997, Materials for Advanced Metallization (MAM '97 Abstracts Booklet), pp. 32–35.*

* cited by examiner

Primary Examiner—Matthew Smith
Assistant Examiner—Lex H. Malsawma
(74) Attorney, Agent, or Firm—Sutherland Asbill & Brennan LLP

(57) ABSTRACT

The present invention provides a chemical mechanical planarization (CMP) polishing composition that polishes metal layers at a good removal rate and that provides good planarization of metal layers in a process that can be readily controlled. The CMP polishing composition of the present composition includes a plurality of abrasive particles, a triazole or a triazole derivative, a ferricyanide salt oxidizing agent and water and has a pH of from about 1 to about 6. In addition, the present invention includes a method for removing at least a portion of a metallization layer by polishing a metallization layer using the CMP polishing composition of the invention.

10 Claims, 1 Drawing Sheet

CHEMICAL MECHANICAL POLISHING COMPOSITION AND METHOD OF POLISHING METAL LAYERS USING SAME

FIELD OF THE INVENTION

The present invention relates to the chemical mechanical planarization (CMP) of semiconductor wafers and more specifically to CMP polishing slurries for polishing metal layers such as copper layers on semiconductor wafers.

BACKGROUND OF THE INVENTION

Integrated circuits are chemically and physically integrated into a substrate such as a silicon or gallium arsenide wafer by patterning layers on a substrate. In particular, semiconductors are formed by providing tungsten or copper wiring or metallization in discrete layers of dielectric films to form a multilayer structure. The metallization is adhered to the dielectric film through a thin liner film comprising tantalum (Ta), tantalum nitride (TaN), titanium (Ti), or titanium nitride (TiN). The metallization layer and the liner film are deposited on a patterned dielectric film and then polished, typically by chemical-mechanical planarization (CMP), to expose the dielectric layer.

The chemical mechanical planarization (CMP) process is a well-known technique in the semiconductor manufacturing industry. In a typical CMP process, the surface of the semiconductor material to be polished is held against a polishing pad at a predetermined pressure while the polishing pad rotates at a predetermined angular speed. The wafer may also rotate. A polishing slurry is supplied to the interface between the polishing pad and the semiconductor material surface to be polished. The polishing slurry is an aqueous solution of an oxidizing agent at a specific pH for chemically transforming the surface of the semiconductor material by oxidation. In addition, abrasive particles such as alumina, silica, or ceria particles for mechanical polishing are also included in the polishing slurry. Thus, a typical CMP process includes chemically transforming the metal layer using an oxidizing agent and mechanically polishing the metal layer using abrasive particles as well as the friction force exerted by the polishing pad on the wafer surface.

One problem with chemical mechanical polishing is that the metallization layer (e.g. copper or tungsten) generally polishes at a different rate than the underlying liner film thereby resulting in uneven planarization. This uneven planarization is generally in the form of overpolishing (dishing) and dielectric erosion. This is particularly true when the metal layer being polished is copper because copper is typically softer and polishes at a faster rate than the metals (e.g. tantalum and tantalum nitride) used in the liner film. Because the faster copper polishing rate can result in overpolishing, a corrosion inhibitor such as benzotriazole (BTA) may be included in the polishing slurry to slow down the rate of copper removal in the lines and vias. However, the presence of a corrosion inhibitor in the slurry also results in a decrease in the rate of planarization and the production of integrated circuits at a slower rate.

One method of overcoming the reduction rate caused by the presence of the corrosion inhibitor and thus increasing the copper polishing rate has been to modify the mechanical polishing parameters in the chemical mechanical planarization process (e.g. carrier rotation, platen rotation, downforce, and backforce). However, increasing the polishing rate by mechanical means results in a process that is difficult to control. As a result, although the polishing rate increases, the polished surface does not possess the desired level of planarity. Specifically, the rate of mechanical removal disadvantageously overcomes the rate of chemical removal resulting in a non-planar polished surface.

As is well understood in the art, the formation of planar layers in the formation of integrated circuits is essential to the operation of these integrated circuits. Therefore, there is a need in the art for a method of polishing metal layers such as copper layers for integrated circuits that provides good planarization without dishing or dielectric erosion. Furthermore, there is a need in the art to increase the rate of metal CMP polishing and particularly copper CMP polishing that does not negatively affect the planarization of the metal layers.

SUMMARY OF THE INVENTION

The present invention provides a chemical mechanical planarization (CMP) polishing composition that produces good planarization of metal layers and particularly copper layers with limited dishing and dielectric erosion. In addition, the CMP polishing composition of the present invention polishes the metal layers at a fast rate that can be easily controlled. Therefore, the present invention produces good quality integrated circuits at a faster rate than prior art processes.

The CMP polishing composition of the present invention provides a combination of a triazole or a triazole derivative and a ferricyanide salt at a pH of between about 1 and about 6 to produce the above benefits. In particular, the present composition includes a plurality of abrasive particles, a triazole or a triazole derivative, a ferricyanide salt oxidizing agent and water and has a pH of from about 3 to about 5. The abrasive particles for use in the invention can be alumina, silica or ceria particles or other particles suitable for CMP polishing. The triazole or triazole derivative is preferably benzotriazole (BTA) and is present in a corrosion-inhibiting effective amount, preferably from 0.05 to 2M. The ferricyanide salt oxidizing agent is preferably potassium ferricyanide ($K_3Fe(CN)_6$) and is present in an oxidizing effective amount, preferably from 0.05 to 2M. The pH of from about 1 to about 6, and preferably between about 3 and about 5, can be produced merely by the addition of the above listed components or buffers can be added to the composition to provide the desired pH.

In addition to the present composition, the invention includes a method for polishing a metallization layer on a semiconductor substrate. In particular, the method comprises removing at least a portion of a metallization layer on a semiconductor wafer by polishing the metallization layer using the CMP polishing composition described above. Preferably, the metallization layer polished in accordance with the invention comprises copper.

These and other features and advantages of the present invention will become more readily apparent to those skilled in the art upon consideration of the following detailed description and accompanying drawings, which describe both the preferred and alternative embodiments of the present invention.

DETAILED DESCRIPTION OF THE PREFERRED EMBODIMENTS

Figure 1:
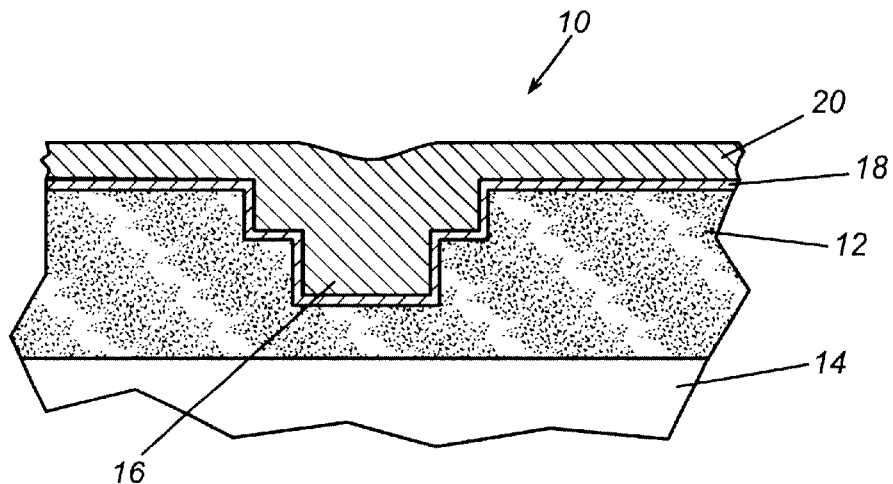
FIG. 1 is a cross-sectional view of a preformed unpolished semiconductor structure in accordance with the invention.

In the drawings and the following detailed description, preferred embodiments are described in detail to enable practice of the invention. Although the invention is described with reference to these specific preferred embodiments, it will be understood that the invention is not limited to these preferred embodiments. But to the contrary, the invention includes numerous alternatives, modifications and equivalents as will become apparent from consideration of the following detailed description and accompanying drawings. In the drawings, like numbers refer to like elements throughout.

The CMP polishing slurry of the present invention comprises a combination of a triazole or a triazole derivative as a corrosion inhibitor and a ferricyanide salt as an oxidizing agent at a pH of from about 3 to about 5. It has been discovered that the combination of these components produces a polishing slurry composition that polishes metal at a fast rate with good planarization. In particular, the combination of these components produces a polishing slurry composition that polishes copper, e.g., at a rate from about 1000 to about 5000 Å/min, with limited dishing.

In the present composition, the triazole or triazole derivative is preferably an unsubstituted or substituted 1,2,3-triazole or 1,2,4-triazole and more preferably is benzotriazole (BTA). The triazole or triazole derivative is present in the composition in a corrosion-inhibiting effective amount. Preferably, the triazole or triazole derivative is present in an amount from about 0.05 to about 2M, more preferably, from about 0.1 to about 1M.

The ferricyanide salt oxidizing agent used in the present composition is preferably potassium ferricyanide ($K_3Fe(CN)_6$) and is present in an oxidizing effective amount. The ferricyanide salt can be provided in either hydrated or anhydrous form. Preferably, the ferricyanide salt is present in an amount from about 0.05 to about 2M, more preferably, from about 0.1 to about 1M.

In addition to the ferricyanide salt, the composition of the invention can include additional oxidizing agents. Any suitable oxidizing agent known in the art for CMP polishing can be used with the ferricyanide salt oxidizing agent of the present invention. Examples of additional oxidizing agents include but are not limited to $H_2O_2$, $Fe(NO_3)$, $H_3PO_4$, $HNO_3$, $KMnO_4$, $KIO3$, $K_3F(CN)_6$, $Ce(NO_3)_4$ and ammonium salts such as ammonium persulfate and ammonium nitrate ($NH_4NO_3$). In particular, $NH_4NO_3$ (the salt of a strong acid and a weak base) can be used to reduce the polishing rate of the slurry composition, if necessary, to produce the desired planarization of the metallization layer. The oxidizing agent can be dissolved in any suitable solvents. For example, conventional solvents such as water and alcohol can be used in the present invention. As will be apparent to a skilled artisan, the concentration of the oxidizing agents in the polishing slurries can vary depending on, e.g., the material to be removed, the desired rate of removal, and the like. Preferably, the additional oxidizing agent is present in an amount from 0 to about 2M, more preferably, from 0 to about 1M.

The above components are preferably provided in an aqueous polishing slurry comprising water and abrasive particles. In addition, the present composition can be in the form of an emulsion that includes an organic phase containing complexing agents dispersed in an aqueous phase containing additives and the like.

The abrasive particles for use in the present invention can be particles of alumina, silica, ceria, titania, germania or zirconia, or any other particles that are suitable for use for polishing metal layers in CMP processes. In addition, the present invention can include combinations of these particles. Preferably, the present invention includes abrasive particles in an amount from about 5 to about 30%, more preferably, from about 10 to about 25% by weight. The abrasive particles preferably have a mean particle size of from about 50 to about 300 nm, more preferably, from about 80 to about 180 nm.

The present composition has a pH of from about 1 to about 6, more preferably of from about 3 to about 5. Although the desired pH can be produced merely through the use of the ferricyanide salt and optional additional oxidizing agents, the present composition can also include buffers to produce the desired pH. For example, buffers such as potassium acetate, acetic acid, ammonium hydroxide, potassium hydroxide, amines, nitric acid, phosphoric acid, hydrofluoric acid, hydrochloric acid, sulfuric acid, organic acids, and the like, can be used in the present invention to provide the desired pH. In addition, the present composition can include other additives such as surfactants that can be added to the slurry to prevent slurry agglomeration.

In accordance with the present invention, the metal polishing rate can be controlled by controlling the amounts of the chemical components in the composition. For example, the polishing rate tends to increase when the ferricyanide ion concentration is increased and tends to decrease when the ammonium nitrate or BTA concentrations are increased. Therefore, the polishing rate can be controlled in situ by changing the concentrations of these components in the composition as it is being applied to the metal surface being polished. Furthermore, the presence of buffers can be used to modify the pH and thus the polishing rate as the rate of metal removal is typically dependent on the pH of the slurry composition. Therefore, because the polishing rate can be controlled, the amount of overpolishing can be reduced in accordance with the invention.

FIG. 1 illustrates a preformed unpolished semiconductor structure 10 that can be subjected to CMP polishing in accordance with the invention. Generally, to make the semiconductor structure 10, a dielectric layer 12 is deposited on a semiconductor substrate or wafer 14 such as a silicon or gallium arsenide wafer and planarized. The dielectric layer 12 typically contains silicon dioxide ($SiO_2$), borophosphosilicate glass (BPSG), or phosphosilicate glass (PSG). After the surface of the dielectric layer 12 is planarized, it is etched to form a series of trenches (lines) and holes (vias) therein according to a prototype design. For example, FIG. 1 illustrates a trench 16 Thereafter, a thin liner film 18 of tantalum (Ta) and tantalum nitride (TaN) or titanium (Ti) and titanium nitride (TiN) is formed over the etched surface of the dielectric layer including the trenches and holes. A metal such as copper or tungsten is then superimposed over the liner film to form a metallization layer 20 filling the trenches and holes. Preferably, the liner film 18 is a Ta/TaN layer and the metallization layer 20 is copper.

Figure 2:
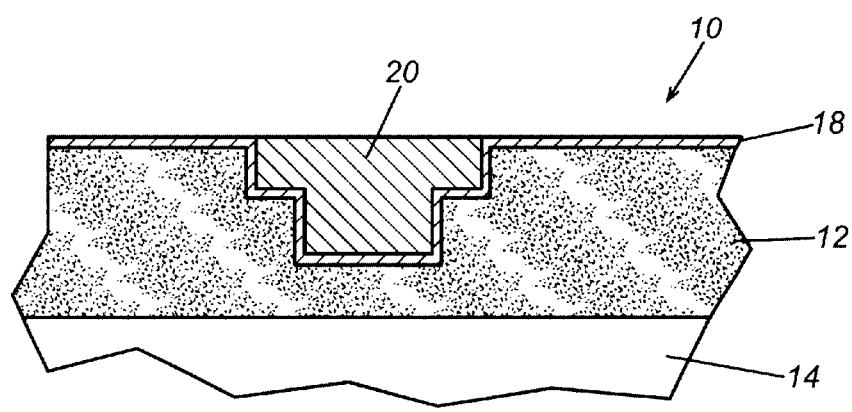
FIG. 2 is a cross-sectional view of the semiconductor structure of FIG. 1 in which the metallization layer superimposed over the liner film has been removed by CMP polishing according to the present invention.
Figure 3:
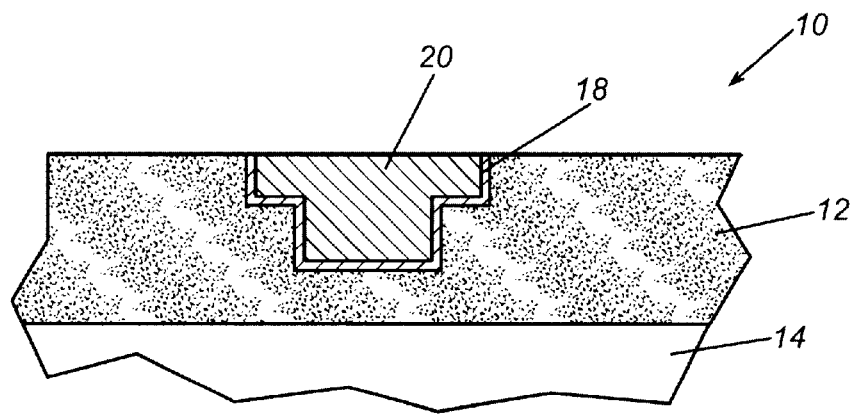
FIG. 3 illustrates a cross-sectional view of a semiconductor structure after CMP polishing according to the present invention.

After the semiconductor structure 10 is formed, the portion of the metallization layer 20 and the liner film 18 that is outside the trenches or holes is removed from the dielectric surface by CMP polishing to expose the underlying dielectric layer 12. In particular, using the CMP polishing composition described above, a portion of the metallization layer 20 is first removed exposing the liner film 18 as shown in FIG. 2. Then, the liner film 18 is removed exposing the dielectric layer 12 as shown in FIG. 3. In accordance with the invention, the liner film 18 can be removed using the CMP polishing slurry described above or by using a different slurry. It will be apparent to a skilled artisan that the optimal extent of removal in the polishing step is determined by factors such as, e.g., the total processing time desired, the polishing rate and the susceptibility of the metallization material to dishing. In addition, certain properties of the polishing process such as the carrier rotation, platen rotation, downforce, backforce, and the like, can affect the rate of removal as understood by the skilled artisan.

The portion of the metallization layer 20 and liner film 18 that fills the trenches and holes is preferably not removed in the CMP polishing step. In other words, preferably little or no dishing or overpolishing results in accordance with the invention. Therefore, in referring to the amount of metallization 20 and liner 18 film removed during the CMP polishing step, the present application does not include the metallization and liner film in the trenches and holes of the semiconductor structure 10.

As shown in FIG. 3, the polishing of the metallization layer 20 and the liner film 18 is preferably stopped after the liner film is removed thereby exposing the dielectric layer 12. Methods and devices for endpoint detection are well known in the art and any suitable conventional methods can be used with the present invention. For example, the endpoint can be determined simply by estimating the polishing time based on the average thickness of the metallization layer 20 and the liner film 18, as well as the metal and liner film polishing rates. Alternatively, any conventional endpoint monitoring system known in the art can be used. Preferably, an in situ method is used. Examples of in situ endpoint detection methods include, e.g., detecting the change of friction as disclosed in, e.g., U.S. Pat. No. 5,036,015; acoustical methods as disclosed in, e.g., U.S. Pat. No. 5,222,329 and U.S. Pat. No. 5,240,552; and thermal methods as disclosed in, e.g., U.S. Pat. No. 5,196,353 and U.S. Pat. No. 5,643,050.

Once the polishing step is completed, the exposed dielectric layer 12 is typically rinsed with deionized water and buffed, i.e., polished or replanarized, to remove any defects such as scratches or embedded particles formed in the dielectric surface during the CMP process The buffing steps are well known in the art and suitable methods would be apparent to a skilled person in the art.

The chemical mechanical planarization (CMP) polishing composition of the invention and corresponding method can be used to polish metal layers with a fast removal rate, and provide good planarization of the metal layers with limited dishing and dielectric erosion. The present composition and method are particularly useful in polishing copper, which is typically susceptible to dishing, with good planarity. In particular, it has been discovered that by combining a triazole or triazole derivative corrosion inhibitor and a ferricyanide salt oxidizing agent at a pH of from about 3 to about 5, the CMP polishing composition of the present invention polishes metal layers such as copper at a fast rate to produce good planarization in a process that can be readily controlled. Thus, the present invention allows good quality integrated circuits to be produced at a fast rate compared to prior art processes.

It is understood that upon reading the above description of the present invention and reviewing the accompanying drawings, one skilled in the art could make changes and variations therefrom. These changes and variations are included in the spirit and scope of the following appended claims.

That which is claimed:

1. A chemical mechanical planarization polishing composition comprising:

a plurality of abrasive particles;

a corrosion-inhibiting effective amount of a triazole or a triazole derivative wherein the corrosion-inhibiting effective amount of the triazole or triazole derivative is from about 0.05 to about 2M;

an oxidizing effective amount of a ferricyanide salt oxidizing agent; and water;

the composition having a pH of from about 1 to about 6.

2. The polishing composition according to claim 1, wherein the triazole or triazole derivative is benzotriazole (BTA).

3. The polishing composition according to claim 1, wherein the ferricyanide salt is potassium ferricyanide.

4. The polishing composition according to claim 1, having a pH from about 3 to about 5.

5. The polishing composition according to claim 1, wherein the oxidizing effective amount of the ferricyanide salt is from about 0.05 to about 2M.

6. The polishing composition according to claim 1, wherein the abrasive particles are alumina particles.

7. The polishing composition according to claim 1, wherein the abrasive particles are silica particles.

8. The polishing composition according to claim 1, further comprising a buffer.

9. A chemical mechanical planarization polishing slurry comprising:

a plurality of abrasive particles;

from about 0.05 to about 2M benzotriazole (BTA);

from about 0.05 to about 2M potassium ferricyanide; and water;

said polishing slurry having a pH of from about 3 to about 5.

10. The polishing composition according to claim 9, wherein the abrasive particles are alumina particles.

* * * * *